(12) United States Patent
Arnold et al.

(10) Patent No.: US 8,105,756 B2
(45) Date of Patent: Jan. 31, 2012

(54) METHOD FOR PREPARING A PRINTING FORM USING VIBRATIONAL ENERGY

(75) Inventors: Carl Bernard Arnold, Newark, DE (US); Thomas William Harding, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 545 days.

(21) Appl. No.: 12/372,173

(22) Filed: Feb. 17, 2009

(65) Prior Publication Data

US 2010/0209844 A1    Aug. 19, 2010

(51) Int. Cl.
*G03F 7/00* (2006.01)
*B41N 7/00* (2006.01)

(52) U.S. Cl. ............... 430/306; 430/935; 101/463.1

(58) Field of Classification Search .......... 430/306
See application file for complete search history.

(56) References Cited

U.S. PATENT DOCUMENTS

| | | | |
|---|---|---|---|
| 4,612,267 A | | 9/1986 | Heitmann et al. |
| 5,390,013 A | * | 2/1995 | Snelling ............... 399/328 |
| 5,480,501 A | * | 1/1996 | Stewart et al. ............. 156/73.1 |
| 7,139,519 B2 | * | 11/2006 | Darcy et al. ............. 399/302 |
| 7,422,840 B2 | * | 9/2008 | Dudek et al. ............. 430/302 |

FOREIGN PATENT DOCUMENTS

| | | |
|---|---|---|
| EP | 0 763 425 A1 | 3/1997 |
| WO | WO 90/00973 A1 | 2/1997 |
| WO | WO 01/44874 A1 | 6/2001 |

OTHER PUBLICATIONS

Dupont De Nemours: "Assembly Techniques—Category II Welding, Adhesive Bonding", May 16, 2006, XP002587923, Retrieved from the Internet: URL:http://plastics.dupont.com/plastics/pdflit/europe/design/L12565_10.pdf [retrieved on Jun. 18, 2010] * p. 111-p. 119; figure 10.41 *.

Harutaka Mekaru et al: "Effect of applying ultrasonic vibration in thermal nanoimprint lithography", Microsystem Technologies; Micro and Nanosystems Information Storage and Processing Systems, Springer, Berlin, DE, vol. 14, No. 9-11, Jan. 9, 2008, pp. 1325-1333, XP019632833, ISSN: 1432-1858 * pp. 1327, 132; figures 2, 4 *.

* cited by examiner

*Primary Examiner* — Cynthia Kelly
*Assistant Examiner* — Chanceity Robinson
(74) *Attorney, Agent, or Firm* — Thomas H. Magee

(57) ABSTRACT

A method and apparatus for preparing a relief printing form from a photosensitive element that includes a photopolymerizable composition layer having an exterior surface and capable of being partially liquefied. The method includes the steps of (a) heating the exterior surface of the photopolymerizable composition layer to a temperature sufficient to cause a portion of the layer to liquefy, forming the liquefied material; and (b) removing the liquefied material; wherein the heating step is performed using vibrationally-induced frictional energy.

11 Claims, 1 Drawing Sheet

METHOD FOR PREPARING A PRINTING FORM USING VIBRATIONAL ENERGY

BACKGROUND OF THE INVENTION

1. Field of the Invention

This invention pertains to a method and apparatus for thermally treating a photosensitive element, and particularly to a method and apparatus wherein the thermal treating is provided by vibrationally-induced frictional energy to create a printing form from the photosensitive element.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photo-polymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable composition layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer or the photopolymerizable layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened unirradiated material and then is separated or removed from the photosensitive layer. The cycle of heating and contacting the photosensitive layer may need to be repeated several times in order to sufficiently remove the flowable composition from the un-irradiated areas and form a relief structure suitable for printing. After such processing, there remains a relief structure having raised features of irradiated, hardened composition that represents the irradiated image.

Processors for thermal development of flexographic printing elements are known. U.S. Pat. No. 5,279,697 describes an automated process and apparatuses for handling an irradiated printing element and accomplishing heating and pressing to remove the unirradiated composition from the element. One embodiment of the thermal development apparatus includes the heated plate that is brought into intimate contact with an absorbent material which in turn contacts an upper surface of a flexible (photosensitive) sheet that resides on a base. The heated plate remains in place for a sufficient time to liquefy a portion of polymer material in the sheet and allow the liquefied polymer material to be absorbed onto the absorbent material. The heated plate is removed and the flexible sheet and the absorbent material advance together while rolls separate the absorbent material from the formed flexographic sheet.

U.S. Pat. No. 5,279,697 describes another embodiment of an automated process and apparatus for handling an irradiated printing element and accomplishing repeated heating and pressing to remove the unirradiated composition from the element. U.S. Pat. No. 6,797,454 B1 also describes a method and apparatus for thermal processing a photosensitive element. In both thermal processing apparatuses the absorbent material is a continuous sheet of a web, typically a nonwoven, which is passed over a hot roll. The hot roll is urged towards a drum carrying the photosensitive element pressing the web against the photosensitive element and forming a nip. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent web. As the drum and hot roll rotate in contact together, the web is pressed against the photosensitive element to absorb the liquefied unirradiated composition and is then separated from the element.

It is known that the thermal process has productivity and environmental advantages over the solvent treatment process. However, in the existing thermal process, both the photosensitive layer and the support are heated to soften or melt the unirradiated or uncured material for absorption by the absorbent material. Stated another way, in the existing thermal process the entire photosensitive element including the photopolymerized (i.e., cured) portions and the non-polymerized (i.e., uncured) portions of the photosensitive layer, as well as the support, are heated simply to cause the softening of the non-polymerized portions. Heating of the polymerized portions and the support can at times detrimentally impact the quality of the resulting printing form.

In particular, heat can distort the support. With repeated cycles of heating and contacting of the absorbent material to the photosensitive element, the temperature of the support can increase to a temperature higher than its glass transition temperature. Any non-uniform strains induced in the structure of the photosensitive element while the element including the support is hot result in deformations that remain after the element has cooled or returned to room temperature. The deformations are waves of localized distortions resulting in a non-planar topography of the photosensitive element. In addition, it is common that supports for photosensitive elements have shrinkage characteristics when heated that are non-uniform in the x and y planar directions. A problem presented by distortion and non-uniform shrinkage of the support is that for three- and four-color printing processes, three or four plates must be made with images that register exactly for the different colors to print together and produce an accurate final image. If one of the printing forms distorts or shrinks in one direction and the other distorts or shrinks in another direction, the images will not register correctly to produce a quality color print.

Also in the existing thermal treatment methods, the thermal energy is delivered by infrared radiation and/or conduction transfer. Infrared radiation heats the top surface of the photosensitive element and does not selectively heat the non-polymerized portions. Heating by conduction transfer via a hot roll carrying the absorbent material to the top surface of the photosensitive element can be inhibited by the insulating nature of the absorbent material. Heating by conduction transfer from the back of the photosensitive element, that is, from the support side, heats the entire photosensitive element including the support which is prone to distortion and shrinkage at the temperature necessary for softening of the non-polymerized portions of the photosensitive layer.

In addition due to thermal mass of the roll/s, the roll or rolls that are used for conduction heating of the top surface of the photosensitive element take a long time to heat-up and reach the development temperature. The thermal mass of the hot roll/s also impacts the ability to rapidly change the development temperature during processing, particularly from one cycle of heating and contacting to the next, since it takes time for the hot roll/s to reach a different development temperature.

Thus, there is a need for thermal treatment of photosensitive elements that is capable of providing localized and targeted heating of the photosensitive element. It is desirable for thermal treatment to heat only the surface of the photosensitive element to accomplish softening of the non-polymerized portions of the photopolymerizable layer, and avoid heating the support to minimize distortion and shrinkage of the printing form.

SUMMARY OF THE INVENTION

The present invention provides a method for preparing a relief printing form from a photosensitive element having an exterior surface and comprising a layer of a photopolymerizable composition that is capable of being partially liquefied. The method includes (a) heating the exterior surface of the photosensitive element to a temperature sufficient to cause a portion of the layer to liquefy, forming liquefied material; and (b) removing at least a portion of the liquefied material, wherein the heating step is performed using vibrational energy to induce frictional heating.

In accordance with another aspect of this invention there is provided an apparatus for preparing a relief printing form from a photosensitive element having an exterior surface and comprising a layer of a photopolymerizable composition capable of being partially liquefied. The apparatus includes (a) means for heating the exterior surface of the photopolymerizable composition layer to a temperature sufficient to cause a portion of the layer to liquefy, forming liquefied material; and (b) means for removing at least a portion of the liquefied material, wherein the heating means is frictional energy generated from a vibrating assembly.

BRIEF DESCRIPTION OF THE DRAWINGS

The invention can be more fully understood from the following detailed description thereof in connection with the accompanying drawings described as follows.

DESCRIPTION OF THE PREFERRED EMBODIMENTS

Figure 1:
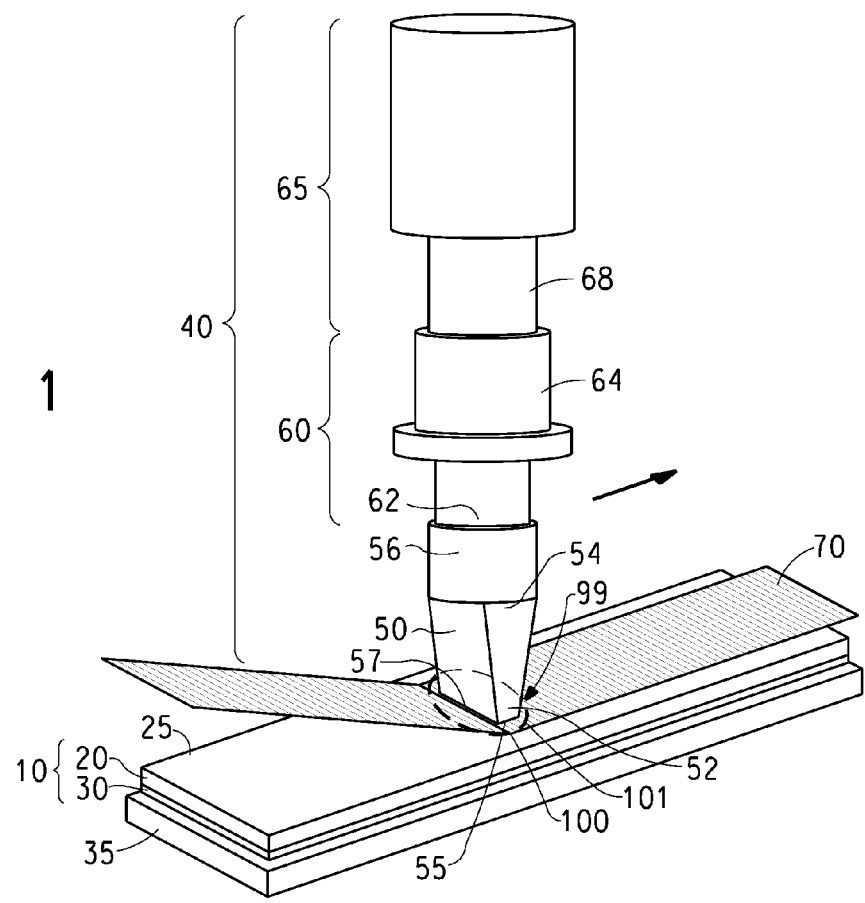
FIG. 1 is a schematic perspective view of a first embodiment of the present invention depicting one embodiment of a means for generating vibrational energy suitable for frictional heating a planar-shaped photosensitive element.

Throughout the following detailed description, similar reference characters refer to similar elements in all figures of the drawings.

The present invention relates to an apparatus and method for thermally developing a photosensitive element using vibrational energy for heating to form a relief printing form. In particular, the present invention contemplates an apparatus and a method capable of vibrationally-inducing frictional energy to heat a photosensitive element having a photosensitive layer or a layer of a photopolymerizable composition, that is capable of being partially liquefied to a temperature sufficient to melt or soften or flow ("liquefy") at least a portion of the layer followed by removal of the liquefied composition.

The present apparatus and method for thermal treatment is capable of providing localized and targeted heating of the photosensitive element, and can thus overcome many of the disadvantages of prior thermal development systems. In particular, the present thermal treatment is capable of heating an exterior surface of the photosensitive element to the extent necessary to accomplish melting, softening, or flow of the non-polymerized portions of the photopolymerizable layer. The localized and targeted heating of the exterior surface of the photosensitive element avoids heating the support of the photosensitive element and thereby reduces or eliminates the heat-related detrimental effects, such as distortions, waves and/or non-uniform shrinkage, for the resulting relief printing form. The present invention generates vibrational energy to induce frictional energy to heat the photosensitive element. Since heat transfer created by vibrational energy is not limited by the insulating properties of the absorbent material, the photosensitive element can be heated more effectively. Heating by vibrationally-induced frictional energy provides particular advantage in the thermal development of thin photosensitive elements, that is, photosensitive elements in which the photopolymerizable layer has a thickness of about 60 mils (0.15 cm) or less. Vibrational energy is capable of frictional heating only the surface in proximity with the vibrational means, and does not transmit through the thin photopolymerizable layer to heat the support. Another advantage of the present invention is that vibrational energy can be easily adjusted which allows for a rapid change in the heat generated, and thereby enables a nearly instantaneous operation and immediate changes in temperature experienced by the photosensitive element at the exterior surface. This can shorten processing time, increase machine throughput, and decrease defects while maintaining better control of the thermal development process.

The present invention includes a means for generating vibrational energy ("vibrational means") to induce frictional energy to heat the photosensitive element. Vibrational energy encompasses ultrasonic energy, i.e., vibrational energy having a frequency above about 20 kilohertz, and sonic energy, i.e., vibrational energy having a frequency between about 16 hertz and about 20 kilohertz, which may be referred to herein as ultrasonic means and sonic means, respectively. The vibrational energy resides adjacent the exterior surface of the element to provide for localized and targeted heating such that the photosensitive element is not heated in its entirety and/or the entire exterior surface of the element is only heated by zone upon intimate association, i.e., direct or indirect contact, with the vibrational means. In most instances, the entire exterior surface of the photosensitive element is not heated simultaneously. The vibrational energy induces frictional heating at a localized or targeted contact zone and thus may be referred to herein as zone heating. In some embodiments of the present invention, the vibrational means selectively provides frictional energy to heat the photosensitive element only at an interface between the photosensitive element and the vibrational means, and thus cause the material at the interface to at least partially liquefy. In some embodiments of the present invention, the vibrational means selectively provides frictional energy to heat only at an interface between the photosensitive element and an intermediate medium or a development medium, and cause the material at the interface to at least partially liquefy. In some embodiments heating of the exterior surface is conducted zone-wise, from one localized zone of contact to a second zone of contact and subsequent zones of contact by the vibrational means as the vibrational means moves across the exterior surface of the photosensitive element. Hereinafter, the method of the present invention may also be referred to generically as a "vibrational-thermal development method", or more specifically as an "ultrasonic-thermal development method," or as a "sonic-thermal development method".

In the present method and apparatus, the photosensitive element is thermally treated, i.e., heated, with frictional energy that is generated by vibrational energy to a development temperature that causes uncured or unirradiated portions of the photopolymerizable composition layer to liquefy, soften, melt, or flow. In many embodiments the liquefied portions are removed by contacting the photosensitive element with a development medium and separating the element and the medium. The photosensitive element includes a support and at least a layer of a photopolymerizable composition adjacent the support. The photopolymerizable composition layer, which may also be referred to as the photopolymerizable layer, is capable of being partially liquefied. The development medium may also be referred to herein as development material, absorbent material, development web, absorbent web, or web. Cured or irradiated portions of the photopolymerizable composition layer have a melting or softening or liquefying temperature higher than the uncured or unirradiated portions of the photopolymerizable composition layer and therefore do not liquefy at the temperature or the range of temperature for thermal development. Unirradiated portions of the photopolymerizable composition layer are portions that are not exposed to actinic radiation, and may also be referred to herein as uncured portions, or unpolymerized portions.

The present invention employs a novel method and apparatus for heating the photosensitive element with vibrational energy that creates friction at a localized contact zone ("zone of contact") on the exterior surface of the photosensitive element. In some embodiments, the localized contact zone will be on the exterior surface of the photopolymerizable layer of the element. Since the photosensitive element may include one or more additional layers on or adjacent the photopolymerizable layer opposite the support, in other embodiments the localized contact zone will be on an exterior surface of the one or more additional layers of the photosensitive element.

The term "melt" is used to describe the behavior of the uncured or unirradiated portions of the photopolymerizable composition layer subjected to an elevated temperature that softens and reduces the viscosity to permit removal from the photosensitive element, for example, by absorption with a development medium. The material of the meltable portion of the photopolymerizable composition layer is usually a viscoelastic material which does not have a sharp transition between a solid and a liquid, so the process functions to absorb the heated photopolymerizable composition layer at any temperature above some threshold for absorption in the development medium. Thus, the uncured portions of the photopolymerizable composition layer soften or liquefy when subjected to an elevated temperature. However throughout this specification the terms "melting," "softening," "flowing," and "liquefying," may be used to describe the behavior of the heated uncured portions of the photopolymerizable composition layer, regardless of whether the composition may or may not have a sharp transition temperature between a solid and a liquid state. A wide temperature range may be utilized to "melt" the photopolymerizable composition layer for the purposes of this invention. Absorption may be slower at lower temperatures and faster at higher temperatures during successful operation of the process.

In the present invention, thermal development by vibrational means includes heating an exterior surface of the photosensitive element to a temperature sufficient to cause a portion of the photopolymerizable layer to liquefy, i.e., melt, soften, flow. The photosensitive element is zone-wise heated to a surface temperature above about 40° C. (104° F.), preferably from about 40° C. to about 230° C. (104-446° F.), in order to liquefy or effect melting or flowing of the uncured portions of the photopolymerizable composition layer in the particular zone in and around a contact location or contact point. Zone-wise heating of the photosensitive element occurs by the emission of vibrational energy from the vibrational means creating frictional energy upon contacting the exterior surface either directly or indirectly through the development medium or the intermediate medium. A contact point, which may also be referred to as a contact zone, is a location that the vibrational means contacts (directly or indirectly) the exterior surface of the element. The heating zone area may be the same as or may be larger than the area of the contact zone. In some embodiments of the present invention the entire photosensitive element is not heated at the same time, instead as the vibrational means traverses from one contact point to another contact point on the photosensitive element, localized zones in and around a given contact point are subjected to heat treatment with the vibrational energy. At least one photopolymerizable composition layer (and additional layer/s if present) is heated by frictional energy induced from vibrational means to a temperature sufficient to effect melting of the uncured portions but not so high as to effect melting or distortion of the cured or irradiated portions of the layer. In some embodiments, one or more additional layers disposed above the photopolymerizable composition layer may soften or melt or flow and be removed by, for example, absorption by a development medium. In other embodiments, one or more additional layers disposed above the photopolymerizable layer may lift, or fracture, or crack, in whole or in part, upon heating of the photopolymerizable layer and be removed with the uncured portions of the photopolymerizable layer or by the development medium. The vibrational-thermal development process can be conducted with one or more cycles of heating the photopolymerizable layer and removing the uncured portions of the photopolymerizable layer.

The removal of the uncured portions from the photosensitive element is not limited. The uncured portions can be removed from the cured portions of the composition layer by any means including air or liquid stream under pressure as described in U.S. publication 2004/0048199 A1; vacuum as described in Japanese publication 53-008655; contacting with an absorbent material as described in U.S. Pat. No. 3,060,023, U.S. Pat. No. 3,264,103, U.S. Pat. No. 5,015,556, U.S. Pat. No. 5,175,072, U.S. Pat. No. 5,215,859, U.S. Pat. No. 5,279,697, and U.S. Pat. No. 6,797,454, and combinations thereof. One particularly suitable method for removing the uncured portions is by contacting the exterior surface of the element to an absorbent surface, such as the development medium, to absorb or wick away or blot the melt portions.

In most embodiments, the vibrational-thermal development process provides frictional energy to heat the exterior surface of the photosensitive element using the vibrational means to support the development medium in contact with the exterior surface of the photosensitive element. The uncured portions of the photopolymerizable layer are removed upon separation of the development medium from the photosensitive element. In some embodiments, vibrational-thermal development is conducted with more than one cycle of zone-wise heating the photosensitive element, where the cycle encompasses zone-wise contacting by the vibrational means to the photosensitive element with the development medium, and zone-wise removing the uncured material from the photopolymerizable layer to a suitable relief depth, because uncured portions of the photopolymerizable layer may only partially liquefy upon heating. In other embodiments, the vibrational means frictionally heats the exterior surface of the photosensitive element but does not support the development medium in contact with the exterior surface, and instead a separate support member supports a development medium into contact with the exterior surface to effect removal of the uncured portions from the element.

The vibrational-thermal treating steps of heating the photosensitive element and removing the uncured portions of the photopolymerizable layer can be done at the same time or in sequence provided that the uncured portions of the photosensitive layer are still soft or in a melt state when removed. Similarly, the vibrational-thermal treating steps of heating the photosensitive element with frictional energy and contacting the exterior surface of the element with the development medium can be done at the same time, or in sequence provided that the uncured portions of the photosensitive layer are still sufficiently liquefied, i.e., softened or in a melt state that the uncured portions are appropriately absorbed or blotted when contacted with the development medium.

The present invention employs means for generating vibrational energy ("vibrational means") to induce frictional energy to heat, and liquefy the uncured or unirradiated portion/s of the photopolymerizable composition layer. The vibrational means is disposed adjacent the exterior surface of the photosensitive element, that is, adjacent the portion of the photopolymerizable composition layer that will be partially liquefied. The photosensitive element has a side opposite the exterior surface that resides on or adjacent a base member, which may be referred to as an anvil. The base member should be a rigid or substantially rigid so that the base member resists defection when pressure is applied by the vibrational means. The base member should have sufficient mass to prevent or substantially prevent vibrating. The ability of the base member to resist deflection and vibration can depend upon the thickness and the type of material forming the base member. In most cases, the base member is composed of a metal, but is not so limited provided the material has suitable rigidity and does not vibrate. Metals suitable for use as the base member include, but are not limited to steel and aluminum. An assembly of the vibrational means includes a vibrating horn and a transducer, and optionally a booster section. In some embodiments the components of the assembly, i.e., the horn, the transducer, and optional booster section, are tuned such that the vibrating horn is an ultrasonic horn, that is, a horn that produces a vibrational frequency of greater than or equal to 20 kilohertz. In other embodiments, the components of the assembly are tuned such that the vibrating horn is a sonic horn, that is, a horn that produces a vibrational frequency of about 20 hertz to 20 kilohertz. In one embodiment, the vibrating horn has an end that is coupled to the transducer. In another embodiment, the end of the vibrating horn is coupled to the booster which in turn is coupled to the transducer. The vibrating horn and the transducer, and optionally the booster, are coupled together to form a resonant stack assembly that vibrates at a desired frequency to frictionally heat the exterior surface of the photosensitive element. The vibrating assembly has an axis formed by the alignment of the vibrating horn, the transducer and the optional booster into the resonant stack.

The vibrating horn includes an end opposite the end coupled to the transducer or the booster, which may be referred to as a distal end. The distal end of the vibrating horn may directly contact or may not contact the exterior surface of the photosensitive element. The distal end of the vibrational means frictionally heats a localized zone on the exterior surface of the photopolymerizable composition layer. In some embodiments where the vibrational means directly contacts the exterior surface, a means for removing the liquefied portions is adjacent the localized zone, which in many cases is immediately or substantially immediately after the vibrational means so that the liquefied portions can be removed before substantial cooling. In some embodiments where the vibrational means does not directly contact the exterior surface, an intermediate medium or the development medium may be interposed between an end of the vibrating horn and the exterior surface of the photosensitive element. The vibrating horn contacts a side of the intermediate medium or the development medium that is opposite to a side contacting the exterior surface of the photosensitive element. A nip is formed at the localized zone where the distal end of the vibrating horn contacts the intermediate or development medium with the photosensitive element. Stated another way, at the nip the distal end of the vibrational means contacts one side of the intermediate or development medium and the exterior surface of the photosensitive element contacts an opposite side of the intermediate or development medium, but the vibrational means does not directly contact the exterior surface of the photosensitive element. In most embodiments, the development medium absorbs or blots or wicks liquefied portions from the photosensitive element at the localized zone where the vibrationally-generated friction heats the exterior surface. The vibrational means can also facilitate intimate contact between the development medium and the exterior surface of the photopolymerizable composition layer by pressing the development medium upon the photopolymerizable composition layer at the point of contact. The intimate contact improves the absorption of the liquefied unirradiated material from the photopolymerizable composition layer into the development medium. In some embodiments, the intermediate medium can act as barrier that protects the horn from the liquefied photopolymerizable material while allowing the vibrationally-generated friction to heat the exterior surface at the localized zone. In embodiments where the vibrating horn directly contacts the photosensitive element or where a non-absorptive intermediate medium is interposed between the vibrating horn and the photosensitive element, a means for removing the liquefied portions is adjacent the localized zone where the vibrational means has heated the photosensitive element.

The distal end of the horn of the means for generating vibrational energy has a surface that is adjacent the exterior surface of the photosensitive element and that is considered a contacting surface of the vibrational means. In most embodiments, the contacting surface of the vibrational horn is oriented parallel or substantially parallel to the exterior surface of the photosensitive element, but is not necessarily limited to this orientation for contacting. Depending on orientation of the vibrational assembly relative to the exterior surface of the photosensitive element, as well as the shape of the distal end of the vibrating horn, different surfaces of the distal end of the vibrating horn can be the contacting surface. It is also contemplated that more than one surface of the distal end of the vibrating horn can be surfaces contacting the photosensitive element. The distal end of the vibrating horn typically includes a surface perpendicular or substantially perpendicular to the axis of the vibrational assembly, which when oriented parallel or substantially parallel to contact the exterior surface, provides a hammer-like (i.e., vertical) effect by the amplitude of the vibration to frictionally heat the exterior surface. The distal end of the vibrating horn typically also includes one or more surfaces, e.g., side surfaces, which are not perpendicular or substantially perpendicular to the axis of the vibrational assembly, which when oriented parallel or substantially parallel to contact the exterior surface, provides a rubbing (i.e., horizontal or somewhat horizontal) effect by the amplitude of the vibration to frictionally heat the exterior surface. In most embodiments, the axis of the vibrating assembly is perpendicular or substantially perpendicular to the exterior surface of the photosensitive element and the contacting surface of the vibrating horn is perpendicular or substantially perpendicular to the axis. In other embodiments, the axis of the vibrating assembly may be oriented at an angle relative to the exterior surface of the photosensitive element and the contacting surface of the vibrating horn is the surface on the distal end of the horn that is parallel or substantially parallel to the exterior surface. In yet other embodiments, the axis of the vibrating assembly may be oriented at an angle relative to the exterior surface of the photosensitive element and more than one surface of the distal end of the vibrating horn are contacting surfaces that frictionally heat the photosensitive element.

The contacting surface of the vibrating horn may contact the intermediate medium or the development medium or the exterior surface of the photosensitive element. The contacting surface of the vibrating horn has at least one dimension, i.e., width, which can maximize the frictional heating of the exterior surface. The maximum width of the widest dimension of the distal end of the vibrating horn depends upon the operating frequency of the vibrational waves and the material of construction for the vibrational means. A practical maximum width of the largest dimension of the distal end of the vibrating horn typically is equal to one wavelength of sound in the material of construction for the vibrating horn. For example, a vibrating horn composed of titanium or titanium alloy has one wavelength of sound at 20 kilohertz frequency (in the titanium) of about nine to 10 inches, and has one wavelength of sound at 40 kilohertz frequency (in the titanium) of about 4.5 to 5 inches. In another example, a vibrating horn composed of titanium or titanium alloy has one wavelength of sound at 10 kilohertz frequency (i.e., in the sonic range) in the titanium of about 20 inches. In some embodiments, the vibrating horn has the width of the largest dimension of the contacting surface at or near the maximum practical width. In some embodiments, the width of the largest dimension of the vibrating horn can be less than the maximum practical width. However, in this embodiment the zone of heating vibrational means will frictionally heat a smaller zone of contact than possible. In some embodiments, the minimum width of the largest dimension of the distal end of the vibrating horn can be less than 1 inch, to about 0.125 inch. The width of the vibrating horn can be oriented in any direction relative to the exterior surface of the photosensitive element. In some embodiments, the width of the vibrating horn can be oriented parallel to a longest side (i.e., length) of the photosensitive element and, in other embodiments, the width of the vibrating horn can be oriented parallel to a shortest side (i.e., width) of the photosensitive element. In some embodiments, the width of the vibrating horn is at least as long as a transverse dimension of the photosensitive element (the transverse direction is the length in case of the cylindrically-shaped element). In some other embodiments, the width of the vibrating horn may be shorter than, and perhaps significantly shorter than, a dimension of the photosensitive element transverse to the direction of movement of the photosensitive element. If a photosensitive element has a width that is wider than the width of the vibrating horn, more than one assembly of the means for generating vibrational energy can be arranged in any manner suitable to provide frictional heating capability to the exterior surface of the photosensitive element. In some embodiments, the more than one vibrating assemblies can be aligned in a row across the photosensitive element. In other embodiments, the more than one vibrating assemblies may be staggered or offset from one another across the photosensitive element. Each vibrating assembly of the more than one assembly of the vibrational means can be the same or different. Each of the vibrating assemblies would include their own transducer, and optional booster section, with the vibrating horn.

The means for generating vibrational energy to frictionally heat and thereby thermally treat the photosensitive element can traverse the photosensitive element in any direction and/or pattern suitable to heat the exterior surface of the photosensitive element. In some embodiments, the vibrational means can generally move in a direction along the length of the photosensitive element. In one embodiment, the movement of the vibrational means along the exterior surface of the photosensitive element can be controlled such that the vibrating horn has sufficient residence time in contact with the development medium and the photosensitive element at the zone of contact to frictionally heat and to ensure transfer of the unirradiated material even within the recesses of the cured photopolymerizable material. It is within the scope of the present invention to have the vibrational means traverse the exterior surface of the photosensitive element more than one time in accordance with the requirement of the process. Once the vibrational means has moved on to the next zone of contact, the first zone of contact is no longer being heated and is amenable to cooling. Thus, heating of the photosensitive element is conducted only as seen necessary and only at the zone of contact where the development medium is available for immediate removal upon heating of the uncured material at the exterior surface of the photopolymerizable layer of the photosensitive element. In one embodiment, the vibrational means can traverse the length of the photosensitive element in a non-linear direction, for example in waves or in criss-cross motion. In the case of a cylindrically-shaped photosensitive element, the vibrating horn that has a length shorter than the transverse dimension of the element may traverse the exterior surface of the photosensitive element as the element rotates on a support member. In some embodiments, the vibrational means would traverse in a spiral pattern on the exterior surface of the cylindrically-shaped photosensitive element. In another embodiment, the vibrational means can be controlled to traverse the photosensitive element in such manner as to heat only those portions that are uncured. In another embodiment, the vibrational means can be programmed to move at varying speeds, depending upon the mass (or volume) of the underlying uncured photopolymerizable composition layer. In another embodiment, the vibrational means can be controlled to exert different pressure on the exterior surface of the photosensitive element at different zones of contact. This may provide different levels of absorption of the uncured material of the photopolymerizable layer into the development medium at each zone of contact.

Vibrationally-induced frictional energy heats the photosensitive element and provides for controlled deposition of energy at a desired location (i.e., zone of contact) and for a period of time. The deposition of energy providing frictional heating, at any contact zone can be changed as needed to accommodate formation of the relief structure, i.e., good clean out of recessed areas without or only minimal distortion of fine lines and elements, by thermal development of the photosensitive element. The vibrational means can be easily adjusted to alter the frictional energy at the contact zone and thus, can relatively quickly change the temperature of the photosensitive element at the contact zone. That is, changing the frictional energy induced by the vibrational means can readily change the temperature experienced by the photosensitive element at the contact zone. The frictional energy induced by the vibrational means can be easily adjusted by changing one or more of the following parameters on the vibrational means: the amplitude of the vibrational energy; the period of time that the vibrating horn contacts the photosensitive element; and/or, the pressure (or force) that the vibrational means exerts on the photosensitive element. In some cases, changing one or more parameters of the vibrational means will immediately change the frictional energy induced at the contact zone, and will instantaneously or substantially instantaneously change the temperature of the photosensitive element at the contact zone. The amplitude of the vibrational means can be adjusted "on-the-fly" by electronic means at the power supply. In general, power supplies can vary the amplitude essentially over the full 1 to 100% range by input of a control voltage or by digital computer control.

It is contemplated to have different temperature or temperature range for heating different zones of contact. This can help control the rate and amount of transfer of the uncured material of the photopolymerizable composition layer because viscosity of the polymeric material at the zone of contact is a function of temperature, as understood by a person skilled in the art. Thus, for example, if higher rate of transfer or removal of the uncured material is desired, the temperature of the zone of contact is increased. If a lower transfer or removal of the uncured material is desired, the temperature of the zone of contact is maintained lower. In one embodiment, the vibrational means can be programmed to adopt one or more features of the previously described embodiments.

The vibrating horn and the distal end of the horn have a cross-sectional shape that is not limited, and can include, for example, elliptical, arcuate including convex and concave surfaces, parabolic, circular, semi-circular, wedge, triangular, rectangular, and other polygonal shapes. The shape of the vibrating horn can be symmetrical or asymmetrical. The vibrating horn thus may have a cylindrical, a semi-cylindrical, or a non-cylindrical three-dimensional shape. In most embodiments, the vibrating horn has a rectangular cross-sectional shape. In some embodiments, the distal end of the vibrating horn has at least one planar surface or substantially planar surface for frictionally heating the photosensitive element.

The contact surface of the vibrating horn of the vibrational means may optionally include a coating or may be otherwise modified to suit a desired purpose. Such as, for example, the surface may be coated with a non-stick, low-friction material, such as a fluoropolymer, to improve transport of the development medium on the surface. The surface may be coated with other materials to the extent that the coating material itself does not absorb significant amount of the generated vibrational energy. The coating material can be applied in any manner suitable for use. The surface may also be modified by treating the surface, such as plating or anodizing, on a metal ultrasonic means, or by means known to those skilled in the art to provide a polished or roughened surface.

The vibrational means can generate a frequency of acoustic waves in the range of from about 20 hertz to 20 kilohertz or more. In some embodiments, the frequency generated is ultrasonic and equal to or greater than 20 kilohertz. In some embodiments, the ultrasonic frequency generated is from about 20 to about 100 kilohertz. In some other embodiments, the frequency generated is sonic and in the range of about 20 hertz to 20 kilohertz. Frequencies suitable for the ultrasonic means in the preparation of relief printing forms, include but are not limited to 20, 25, 30, 40, 50, and 60 kilohertz. In some embodiments, the frequency of the vibrational means for frictionally heating the photosensitive element can be 20 kilohertz or 40 kilohertz. As is well understood by those skilled in the art, the vibrational means, particularly the vibrating horn and the transducer, is tuned to the desired frequency. In some embodiments where the vibrational means includes a transducer that converts electrical energy into mechanical energy, i.e., a piezotransducer, the vibrational means is designed to provide a particular frequency suitable for use in the present method. However in this embodiment, the frequency once tuned and established for the vibrating assembly is set for the operation of the vibrational means, and is not readily changeable.

The materials of constructing the vibrational means, particularly the vibrating horn, the transducer, and the optional booster include, but are not limited to, solid metals, machined metals, alloys, and combinations thereof. The transducer and the optional booster may together or separately reside in a housing that can be constructed of sheet metal and/or other suitable materials. The material chosen for the vibrating horn should be resistant to thermal distortion at the temperatures associated with thermal development, and be able to resist displacement, i.e., bending and torsion, under the operating forces of the present method. Materials particularly suitable for the vibrating horn include, but are not limited to titanium; titanium alloys, including for example, titanium with 6% aluminum, 4% vanadium; aluminum alloys; monel alloys; and compressed powder metal (CPM) type hardened steels. In most embodiments, the vibrating horn, as well as the booster and transducer, are individually machined from the solid metal. In most embodiments, the material constructing the vibrating horn, as well as the transducer and the optional booster, should have relatively high tensile strength and no or minimal internal acoustical loss. As such, the materials constructing the transducer and the optional booster, are generally the same as the materials suitable for the vibrating horn.

The means for generating vibrational energy includes the transducer which is connected to a power supply to generate mechanical vibrations. The transducer provides vibrations at an established frequency and amplitude. In embodiments where the vibrating horn is connected to the transducer, the frequency and amplitude from the transducer are directly conveyed to the vibrating horn. The method by which the transducer and power supply generate the mechanical vibration is not limited. In most embodiments, the transducer is a piezoelectric transducer which converts electrical signals into mechanical vibrations. In other embodiments, the transducer can be a magnetostrictive transducer which converts electrical energy into mechanical vibrations via magnetic properties of certain materials. In yet other embodiments, the transducer can be an electromagnetic transducer which converts electrical energy into mechanical vibrations via interacting magnetic fields. As is known to those skilled in the art, the transducer should be selected to coordinate with the other components in the vibrational assembly. The transducer should be matched to the power supply and be able to handle the power output of the power supply. Depending upon power and the efficiency of the transducer to convert energy into the mechanical vibrations, the transducer may need to be cooled, which can be accomplished by any suitable means. Cooling the transducer can be done by, for example, blowing air into a housing surrounding the transducer. Depending upon the transducer and power supply, the power supplied is typically between about 20 to about 2000 watt. In most embodiments, the power is between about 200 to about 1000 watt. As is known to those skilled in the art, care must be taken in selecting power supply for the vibrational assembly, since the transducer, as well as the horn and optional booster, can be develop internal cracks if driven so much as to exceed the strength of the material.

The means for generating vibrational energy can include a booster that alters by a set ratio the amplitude of the vibration created by the transducer to produce a different amplitude of the vibration by the vibrating horn. The booster is located intermediate to the vibrating horn and the transducer, coupled at one end to the transducer and at an opposite end to the vibrating horn. In embodiments where the vibrating horn is connected to the transducer via the booster, the frequency from the transducer is conveyed to the vibrating horn, but the booster alters by the set ratio the amplitude so that the vibrating horn produces a different amplitude of vibration. In most embodiments, the booster increases the amplitude of the vibration, but can also decrease the amplitude. In general, the ratio of the booster to change the amplitude of the vibrations from the transducer to the horn can be from 0.5 (a reverse booster) to 3.0 (which boosts amplitude by a factor of three). In many embodiments, the booster increases the amplitude produced by the vibrating horn by a factor of 1.5, 2.0, 2.5, or 3.0.

FIG. 1 shows one embodiment of a method and apparatus for vibrationally-induced thermal development of a planar photosensitive element 10 having a photosensitive layer 20 of a photopolymerizable composition adjacent a support 30. The photosensitive element 10 is mounted on a base member 35 such that an exterior surface 25 of the photosensitive element 10 faces away from the base member 35 and towards a means for generating vibrational energy 40.

In the embodiment shown, the means for generating vibrational energy 40 generates a frequency greater than or equal to 20 kilohertz, and thus may also be referred to as a means for generating ultrasonic energy 40 or ultrasonic means 40. The ultrasonic means 40 is an ultrasonic assembly that includes an ultrasonic horn 50 having a distal end 52 and a proximal end 54; a booster 60 having a first end 62 and a second end 64; and a transducer 65 having a first end 68. In one embodiment, the ultrasonic horn 50 tapers at its distal end 52 but has a broader proximal end 54 connected to or integral with a cylindrical base 56. The booster 60 is coupled at its first end 62 to the cylindrical base 56 of the ultrasonic horn 50 and is coupled at its second end 64 to the first end 68 of the transducer 65. The transducer 65 is a piezoelectric transducer. In the embodiment shown in FIG. 1, a development medium 70 is positioned between the ultrasonic means 40 and the photosensitive element 10. The ultrasonic horn 50 has a surface 55 at its distal end 52 that contacts the development medium 70. The ultrasonic horn 50 can be from about one inch to about nine inches (about 2.54 cm to about 22.86 cm) in width. In the embodiment shown, the ultrasonic means 40 is oriented perpendicular or substantially perpendicular to the exterior surface 25 of the photosensitive element 10. The ultrasonic horn 50 presses the development medium 70, such that sufficiently intimate contact is established between the development medium 70 and the exterior surface 25 of the photosensitive element 10 at a point of contact 100. The ultrasonic means is turned on and ultrasonic energy is converted to frictional energy by the contact surface 55 of the ultrasonic horn 50 vibrating on the development medium 70 at the point of contact 100 on the photosensitive element 10, which creates a localized zone of heating 101 of the photosensitive element. The localized zone of heating 101 is not limited and can be of varying shape, including generally circular, rectangular, oval, or any other random shape, which may or may not depend on the shape of the general contacting surface of the distal end 52 of the ultrasonic horn 50. The localized zone of heating 101 can have the same area, or substantially the same area, or can be larger than the area of the point of contact 100. The localized point of contact 100 on the photosensitive element 10 changes as relative movement occurs between the ultrasonic means 40 and the photosensitive element 10. In the embodiment shown in FIG. 1, the ultrasonic means 40 traverses along a length of the photosensitive element 10 in a direction indicated by the arrow, and the base member 35 with the photosensitive element 10 remaining stationary.

In one embodiment, the contacting surface 55 of the ultrasonic horn 50 contacts the development medium 70 to the exterior surface 25 of the photosensitive element 10 at the contact zone 100, and frictionally heating the photopolymerizable layer 20 in the zone of heating 101 to liquefy at least a portion of the layer. The development medium 70 absorbs or wicks away the liquefied portion of the photopolymerizable layer 20 and is separated from the photosensitive element 10 to remove uncured material from the photopolymerizable layer 20 from the element 10 and form a relief surface in the element 10.

In another embodiment, the contacting surface 55 of the ultrasonic horn 50 has a shape which includes a radius of curvature sufficiently small to form a projecting edge 57 that the development medium 70 can traverse when the development medium is removed from the photosensitive element 10. In one embodiment, the ultrasonic horn 50 has an elliptical shape wherein a narrowed end of the ellipse is the surface 55 that directs the development medium 70 into contact with the photosensitive element 10. In this embodiment, the projecting edge 57 directs the development medium 70 into a recess or recesses of the relief forming areas along the width (transverse dimension) of the photosensitive element 10, thus can provide improved clean out of the uncured material from the photopolymerizable layer 20 of the photosensitive element 10. The radius of curvature is sufficiently small to achieve increased localized pressure at the point of contact 100 between the photosensitive element 10 and the development medium 70. The small contact zone associated with this embodiment typically allows for lower pressing forces to generate local unit contact pressures and local temperature gradients sufficient to drive the development medium 70 into the relief-forming areas. The small contact zone can also minimize the duration (or width) of compression of the photosensitive element 10, which may also help to control the transfer of heat from the ultrasonic means 40 to the photosensitive element 10, and thus minimize distortion in the element 10 due to excess heat. In the embodiment shown, the uncured material of the photopolymerizable layer 20 is liquefied at the zone of heating 101, absorbed or blotted or wicked away by the development medium 70, and removed from the photopolymerizable layer 20 by separating the development medium 70 and the photosensitive element 10.

In some embodiments, pressure can be applied between the ultrasonic horn 50 and the development medium 70 at the point of contact 100 forming a nip 99 that establishes intimate contact between the development medium 70 and the photosensitive element 10. The intimate contact facilitates absorption of the liquefied material into the development medium 70. In other embodiments, the ultrasonic horn 50 of the ultrasonic means 40 does not apply pressure on the development web 70 at the nip 99. The development medium 70 carrying or retaining the liquefied portions of the layer 20 can be separated from the photosensitive element 10 at any time after the first local point of contact 100 between the ultrasonic means 40 with the development medium and the photosensitive element 10 has been substantially completed, provided that the liquefied portions at the first zone of heating 101 have not cooled to the extent that the portions retain or cling in the photopolymerizable layer 20. In most embodiments, the development medium 70 is separated from the photosensitive element at the nip 99 and the zone of heating 101 immediately or substantially immediately after the first local point of contact 100 as the next local point of contact between the ultrasonic means 40 and the element 10 is being made or is conducted. As a trailing edge of the photosensitive element 10 passes the nip 99, the ultrasonic means 40 may cool down or be turn off, the ultrasonic horn 50 can retract away from the nip 99 or point of contact 100 and relative motion between the photosensitive element 10, the development medium 70, and the ultrasonic means 40, may be stopped. The ultrasonic means 40 may return to a leading edge of the photosensitive element 10, to the start position, to begin another cycle of ultrasonic heating the photosensitive element 10, contacting the development medium 70 to the element, and removing the development medium from the element. A cycle of the steps of heating the exterior surface 25 of the photosensitive element 10, contacting the exterior surface 25 with the development medium 70 to absorb or blot or wick away molten (portions) of the photopolymerizable layer 20, and removing the development medium 70 can be repeated as many times as necessary to adequately remove the uncured material from the photopolymerizable composition layer 20 and create sufficient relief depth. However, it is desirable to minimize the number of cycles for suitable system performance, and typically the photopolymerizable element is ultrasonically treated for 1 to 15 cycles.

Figure 2:
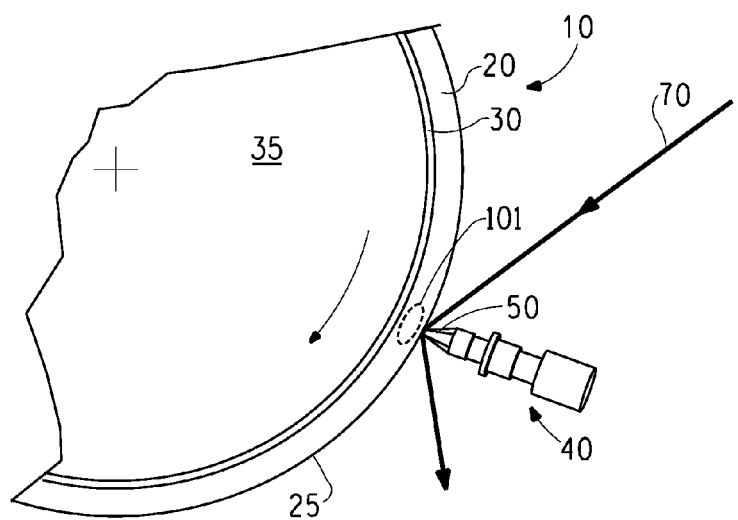
FIG. 2 is a schematic side view of a second embodiment of the present invention depicting an embodiment of a means for generating vibrational energy suitable for frictional heating a cylindrically-shaped photosensitive element.

FIG. 2 shows another embodiment of a method and apparatus for vibrational thermal development wherein the photosensitive element 10 is cylindrically-shaped. In this embodiment, the vibrational means 40 provides ultrasonic vibrational energy, and will be referred to as ultrasonic means 20. The ultrasonic means 40 is disposed adjacent the exterior surface 25 of the photosensitive element 10 which is mounted on a base member 35, i.e., a drum or a roller. In the embodiment shown, the development medium 70 is a web. The development medium 70 traverses about the distal end 52 of the ultrasonic horn 50 and contacts the exterior surface 25 of the photosensitive element 10 to absorb or wick away the uncured material of the photopolymerizable layer 20. In some embodiments, the contacting surface 55 of the ultrasonic horn 50 directs the development medium 70 into the recesses or recessed portions of the photopolymerizable layer 20 of the photosensitive element 10. The operation of the method for ultrasonic-thermal developing the photosensitive element 10 begins with placing the photosensitive element 10 on the drum 35. Optionally, a drum heater or a radiant heater (not shown) may be used to preheat the photosensitive element 10. The ultrasonic vibration induces friction through the development medium 70 on the exterior surface 25 of the photosensitive element 10 at the contacting surface 55 of the ultrasonic horn 50 of the ultrasonic means 40. The drum 35 starts turning and carries the element 10 with it. As a leading edge of the element 10 reaches a position where the ultrasonic horn 50 will bring the development medium 70 into contact with the exterior surface 25 of the photosensitive element 10 at the (initial) zone of contact 100, the ultrasonic means 40 generates ultrasonic vibration to heat the photopolymerizable layer 20 of the photosensitive element 10 in the zone of heating 101 between 40 and 230° C. (104-392° F.). The development medium 70 contacts the exterior surface 25 of the photosensitive element 10, which in most instances is the exterior surface of the photopolymerizable layer 20, and absorbs the liquefied portions of the uncured portions of the photopolymerizable layer 20, and upon separation of the development medium from the photosensitive element removes the uncured portions of the layer 20 to create a relief printing form having a relief pattern or surface. By maintaining more or less intimate contact of the development medium 70 with the photopolymerizable layer 20 that is molten in the uncured regions, a transfer of the uncured material from the photopolymerizable layer 20, i.e., partially liquefied portions, to the development medium 70 takes place. Intimate contact of the development medium 70 to the photopolymerizable layer 20 may be maintained by the pressing the layer and the development medium 70 together with the ultrasonic horn 50 from an initial zone of contact 100 to subsequent zones of contact on the photosensitive element. The development medium 70 may be removed immediately after traversing the zone of contact 100. As a trailing edge of the element 10 passes the nip, the ultrasonic means 40 may cool down or turn off, the ultrasonic horn 50 can retract away from the nip and the development medium may be stopped. Relative motion between the ultrasonic means 40 and the photosensitive element 10 on the drum 35 may return the ultrasonic means 40 to the leading edge of the element 10, to the start position, to begin another cycle of heating the element 10, contacting the web of the development medium 70 to the element 10, and removing the medium 70 from the element 10. A cycle of the steps of heating the photopolymerizable layer 20, contacting the molten (portions) layer with the development medium 70, and removing the development medium 70 can be repeated as many times as necessary to adequately remove the uncured material from the photopolymerizable layer 20 and create sufficient relief depth for use as a relief printing form. However, it is desirable to minimize the number of cycles for suitable system performance, and typically the photopolymerizable element is ultrasonically treated for 1 to 15 cycles.

The present apparatus may include a means for moving which engages the vibrational means to move the vibrational means toward and away from the exterior surface of the photosensitive element. The moving means may move the vibrational means to deliver the development medium or the intermediate medium into contact with the exterior surface of the photosensitive element and to retract from contact when relief structure is formed in the element. Also, the vibrational means may move to position the vibrating horn to accommodate the thickness of different photosensitive elements. In addition, the vibrational means may be moved prior to or during contact of the development medium to the exterior surface in order to position the development medium and accommodate clean-out of uncured photopolymerizable materials for various depths and types of relief areas. The means for moving may move the vibrational means in an arc (about a fixed point) or in a line to accomplish desired orientation/s of the contacting surface at the distal end of the vibrating horn for suitable removal of partially liquefied portions of the photopolymerizable composition layer. It is also contemplated that the means for moving may move the vibrational means in an arc or in a line to one or more positions along or against the direction of travel of the exterior surface of the photosensitive element. The means for moving may also be used to control the depth that the vibrational means penetrates into the exterior surface of the element.

The vibrational means may be coupled to one or more actuating devices, such as air cylinders, as the means for moving the vibrational means. In one embodiment, each end of the vibrational means is mounted onto arms attached to a beam that moves the vibrational means under the urging of one or more air cylinders. It is well within the skill of those in the art to contemplate other embodiments for the means for moving the vibrational means. Pressure cylinders used as the means for moving can also function as a means for pressing the vibrational means onto the photosensitive element. Alternatively the means for moving can function independent of the means for pressing. In some embodiments, the vibrational means is mounted to a frame or a subframe of the apparatus.

The apparatus may also include means for providing relative movement between the development medium and the vibrational means, and/or between the photosensitive element and the vibrational means, so that the vibrational means can traverse the exterior surface of the photosensitive element. In most embodiments in which the development medium is a web, the photosensitive element and the development medium should move at the same or substantially the same linear speed to accomplish vibrationally-induced-thermal development. To maintain this level of relative movement between the development medium and the exterior surface of the photosensitive element, there has to be a substantial relative movement between the vibrational means and the development medium. Relative movement may be provided by moving the development medium, or moving the vibrational means, or moving both the development medium and the vibrational means, or the photosensitive element. In one embodiment, the development medium is a continuous web that traverses the distal end of the vibrating horn that is in a fixed position relative to the exterior surface of the photosensitive element. In another embodiment, the development medium is a continuous web that traverses the distal end of the vibrating horn that is moved into one or more orientations by the means for moving during thermal development.

The present method and apparatus which uses vibrational means to induce frictional heating is advantageous as it reduces the costs and simplifies the manufacture, operation, and maintenance of the apparatus as well as the method of using the apparatus. Also, the vibrational horn allows for a variety of shapes that can bring the development medium or intermediate medium into contact with the element at the nip (or the zone of contact) between the vibrating horn and the development medium or intermediate medium. This is advantageous in that the shape of the vibrating horn surface can be selected to tailor the pressure distribution at the nip according to the needs of the system, i.e., element, apparatus, and method. Additionally, the shape of the vibrating horn can be selected to manage the transfer of heat at the nip (contact zone) independent of the pressure for contacting the development medium into the element. Thus, the printing form that results from the thermal development process with the vibrating horn contacting the development medium can have improved clean out or removal of the uncured or unirradiated photopolymer from the recesses areas of the relief structure and improved uniformity of relief depth, while avoiding excessive heat at temperatures that tend to distort the form.

Another advantage of a small contact zone formed by the contacting surface of the vibrating horn of the vibrational means may be in a reduction in the amount of vapor and/or condensate generated by the ultrasonic-thermal development process compared to a regular thermal development process. Photosensitive compositions may contain one or more components that can vaporize or volatilize when the element is heated to the temperature or temperatures necessary for thermal development to occur. The components that can vaporize or volatilize are generally low molecular weight compounds including monomer. The vapor can condense within a thermal development processor and drip uncontrolled onto different areas of the processor creating a mess within the processor. However, in the ultrasonic-thermal development process, the contact zone is localized, the contact time of the heated surface with the development medium and the photosensitive element is reduced, and the various programming options help create tailored system for heating the photopolymerizable composition layer thereby creating less vapor and/or condensate.

In one embodiment the development medium (or intermediate medium) is a continuous web that is unwound from a supply roll, traverses the vibrating horn surface and then wound up on a take up roll. The web may pass over one or more additional rolls from the supply roll to the vibrating horn, and may pass over one or more additional rolls from the vibrating horn to the take up roll. The web of the development medium may be under tension control, velocity control, or a combination thereof. It is desirable to apply a uniform or substantially uniform pressure at the nip across the width of the photosensitive element during processing. This uniform pressure assumes that the image across the nip is uniform; those skilled in the art will recognize that the pressure applied will vary locally as image elements pass through the nip. Force can be applied to or by the vibrational means to compel the development medium into intimate contact with the photosensitive element. Pressure between about 0.70 kilograms per square centimeter and about 35 kilograms per square centimeter in the contact zone can be adequate for contact to provide suitable frictional energy between the contacting surface of the vibrational means and the photosensitive element. In some embodiments, pressure between about 1.4 and 25 kilograms per square centimeter provides suitable frictional contact between the contacting surface of the vibrational means and the photosensitive element. In some embodiments, pressure between the contacting surface of the vibrational means and the photosensitive element enhances the absorption from the element to the development medium without distorting the composite photosensitive element.

It is contemplated that vibrationally-induced thermal development can be used alone, or in combination with other thermal treatments such as conduction, convection, and/or radiation heating, to heat the photosensitive element to a surface temperature above about 40° C. (104° F.), preferably from about 40° C. to about 230° C. (104-446° F.), in order to liquefy or effect melting or flowing of the uncured portions of the photopolymerizable composition layer. Methods of heating the photosensitive element that combine vibrationally-induced frictional energy with other thermal treatments can apply the vibrational energy before, during, or after the other thermal treatment method/s.

Photosensitive Element

The photosensitive element used for preparing flexographic printing forms includes at least one layer of a photopolymerizable composition. The term "photosensitive" encompasses any system in which the at least one photosensitive layer is capable of initiating a reaction or reactions, particularly photochemical reactions, upon response to actinic radiation. In some embodiments, the photosensitive element includes a support for the photopolymerizable composition layer. In some embodiments, the photopolymerizable composition layer is an elastomeric layer that includes a binder, at least one monomer, and a photoinitiator. The binder can be a thermoplastic binder. The photoinitiator has sensitivity to actinic radiation. Throughout this specification, actinic radiation will include ultraviolet radiation and/or visible light.

Unless otherwise indicated, the term "photosensitive element" encompasses printing precursors capable of undergoing exposure to actinic radiation and treating, to form a surface suitable for printing. Unless otherwise indicated, the "photosensitive element" and "printing form" includes elements or structures in any form which become suitable for printing or are suitable for printing, including, but not limited to, flat sheets, plates, seamless continuous forms, cylindrical forms, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed.

The shape of the photosensitive element for use in the present invention is not limited. In some embodiments, the photosensitive element is in the form of a plate. The plate may be clamped onto a drum for thermal development in the round, or onto a flat base for thermal development in a press. The photosensitive element can include the form of a cylinder, i.e., a sleeve, or a plate-on-sleeve or plate-on-carrier. The photosensitive element may be a continuous, seamless or substantially seamless photopolymerizable composition layer adjacent a cylindrically-shaped substrate. The cylindrically-shaped substrate may be referred to as a sleeve. Typically, plate-on-sleeve is a photosensitive element that includes at least the photopolymerizable composition layer on a planar support, which is then mounted onto a cylindrically-shaped substrate. Typically, the plate-on-carrier is a photosensitive element that includes at least the photopolymerizable composition layer on a planar substrate, which is then mounted onto a flexible sheet, known as a carrier sheet. Oftentimes, multiple photosensitive elements are mounted onto the carrier at various spaced locations. The shape of the photosensitive element for use in the present invention encompasses all the above described embodiments. In one embodiment, the inventive apparatus includes a vibrational means to frictionally heat a planar-shaped photosensitive element. In another embodiment, the inventive apparatus includes a vibrational means to frictionally heat a cylindrically-shaped photosensitive element. It should be understood that one of ordinary skill in the art could accommodate the mounting of the photosensitive element of any shape into the present apparatus having a means for heating with vibrational energy.

The photosensitive element includes at least one layer of a photopolymerizable composition. As used herein, the term "photopolymerizable" is intended to encompass systems that are photopolymerizable, photocrosslinkable, or both. The photopolymerizable composition layer is a solid elastomeric layer formed of the composition comprising a binder, at least one monomer, and a photoinitiator. The photoinitiator has sensitivity to actinic radiation. Throughout this specification actinic light will include ultraviolet radiation and/or visible light. The solid layer of the photopolymerizable composition is treated with heat to form a relief suitable for relief printing, and in particular for flexographic relief printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or have both polymerized or photohardened (i.e., cured) portion/s and unpolymerized (i.e., uncured) portion/s.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly(styrene/isoprene/styrene) block copolymers and poly(styrene/butadiene/styrene) block copolymers. The non-elastomer to elastomer ratio of the A-B-A type block copolymers can be in the range of from 10:90 to 35:65. Generally, the elastomeric binders which are suitable for washout development in aqueous, semi-aqueous, water, or organic solvent washout solutions are also suitable for use in thermal treating wherein the unpolymerized areas of the photopolymerizable composition layer soften, melt, or flow upon heating. The term binder, as used herein, encompasses core shell microgels and blends of microgels and performed macromolecular polymers, such as those disclosed in Fryd et al., U.S. Pat. No. 4,956,252 and Quinn et al., U.S. Pat. No. 5,707,773. It is preferred that the binder be present in an amount of at least 50% by weight of the photosensitive composition. Other suitable photosensitive elastomers that may be used include polyurethane elastomers.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. The addition polymerization compound may also be an oligomer, and can be a single or a mixture of oligomers. The composition can contain a single monomer or a combination of monomers. The monomer compound is present in at least an amount of 5%, and in some embodiments 10 to 20%, by weight of the composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm. A second photoinitiator sensitive to radiation between 220 to 300 nm may optionally be present in the photopolymerizable composition to aid in a finishing exposure that detackifies the relief surface. The second photoinitiator decreases the finishing exposure time necessary to detackify the plate. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable composition layer can vary over a wide range depending upon the type of printing form desired. The photosensitive layer can have a thickness from about 0.002 inch to about 0.250 inch or greater (about 0.005 to about 0.64 cm or greater). In one embodiment, the photosensitive layer can have a thickness from about 0.020 to 0.067 inch (0.5 mm to 1.7 mm). In yet other embodiments, the photosensitive layer can have a thickness from about 0.002 inch to 0.025 inch (0.051 to 0.64 mm).

The photosensitive element may optionally include a support adjacent the layer of the photosensitive composition. The support can be composed of any material or combination of materials that is conventionally used with photosensitive elements used to prepare printing forms. The support typically is selected to be tear resistant and have a fairly high melt point, for example, above the liquefying temperature of the photopolymerizable composition layer formed on the support. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. In some embodiments, the support is a polyester film. In one embodiment, the support is polyethylene terephthalate film. The support may be in sheet form or in cylindrical form, such as a sleeve. The sleeve can be formed of any material or combination of materials conventionally used in forming sleeves for printing. The sleeve can have a single layer, multi-layer, composite, or unitary structure. Sleeves can be made of polymeric films that are typically transparent to actinic radiation and thereby accommodate backflash exposure for building a floor in the cylindrical printing element. Multiple layered sleeves may include an adhesive layer or tape between the layers of flexible material, such as disclosed in U.S. Pat. No. 5,301,610. The sleeve may also be made of non-transparent, actinic radiation blocking materials, such as nickel or glass epoxy. The sleeve may be composed of one or more layers of a resin composition, which can be the same or different, and have fillers and/or fibers incorporated therein. Materials suitable as the resin composition are not limited, examples of which include, epoxy resins; polystyrene and polyvinyl resins, such as polyvinyl chloride and polyvinyl acetate; phenolic resins; and aromatic amine-cured epoxy resins. The fibers used in the resin composition are not limited and can include, for example, glass fibers, aramid fibers, carbon fibers, metal fibers, and ceramic fibers. Fibers incorporated with the sleeve can include continuous, woven, and/or wound materials. The support formed of a resin composition reinforced with fiber is an example of a composite sleeve. In some embodiments, the support has a thickness from 0.002 to 0.050 inch (0.0051 to 0.127 cm). The sleeve can have a wall thickness from about 0.01 and about 6.35 mm or more. In some embodiments, the sleeve has a wall thickness between about 0.25 and 3 mm. In some embodiments, the sleeve has a wall thickness between about 10 to 80 mils (0.25 to 2.0 mm), and in other embodiments 10 to 40 mils (0.25 to 1.0 mm).

Optionally, the element includes an adhesive layer between the support and the photopolymerizable composition layer, or a surface of the support that is adjacent the photopolymerizable composition layer has an adhesion promoting surface to give strong adherence between the support and the photopolymerizable composition layer.

The photopolymerizable composition layer itself can be prepared in many ways by admixing the binder, monomer, initiator, and other ingredients. The photosensitive element can be formed by any suitable method, including but not limited to, extruding and/or calendering, pressing, molding, laminating.

The photosensitive element includes at least one photopolymerizable composition layer, and thus can be a bi- or multi-layer construction. The photosensitive element may include one or more additional layers on or adjacent the photosensitive layer. In most embodiments the one or more additional layers are on a side of the photosensitive layer opposite the support. Examples of additional layers include, but are not limited to, a protective layer, a release layer, a capping layer, an elastomeric layer, a barrier layer, an actinic radiation opaque layer, and combinations thereof. The one or more additional layers can be removable, in whole or in part, during treatment. One or more of the additional layers may cover or only partially cover the photopolymerizable composition layer.

The protective layer, which may also be called a release layer, protects the surface of the photopolymerizable composition layer and can enable the easy removal of a phototool used for the imagewise exposure of the photosensitive element. The photosensitive element may include an elastomeric capping layer on the at least one photopolymerizable composition layer. The elastomeric capping layer is typically part of a multilayer cover element that becomes part of the photosensitive printing element during calendering of the photopolymerizable composition layer. Multilayer cover elements and compositions suitable as the elastomeric capping layer are disclosed in Gruetzmacher et al., U.S. Pat. No. 4,427,759 and U.S. Pat. No. 4,460,675. Upon imagewise exposure to actinic radiation, the elastomeric capping layer has cured portions in which polymerization or crosslinking have occurred and uncured or unirradiated portions which remain unpolymerized, i.e., uncrosslinked. Treating causes the unpolymerized portions of the elastomeric capping layer to be removed along with the photopolymerizable composition layer in order to form the relief surface. The elastomeric capping layer that has been exposed to actinic radiation remains on the surface of the polymerized areas of the photopolymerizable composition layer and becomes the actual printing surface of the printing plate.

The actinic radiation opaque layer is employed in digital direct-to-plate image technology in which laser radiation, typically infrared laser radiation, is used to form a mask of the image for the photosensitive element (instead of the conventional image transparency or phototool). The actinic radiation opaque layer is substantially opaque to actinic radiation that corresponds with the sensitivity of the photopolymerizable material. Digital methods create a mask image in situ on or disposed above the photopolymerizable composition layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The actinic radiation opaque layer is also sensitive to laser radiation that can selectively remove or transfer the opaque layer. In one embodiment, the actinic radiation opaque layer is sensitive to infrared laser radiation, and thus may also be referred to as an infrared laser sensitive layer. The method by which the mask is formed with the radiation opaque layer on the photosensitive element is not limited.

In one embodiment, the photosensitive element may include the actinic radiation opaque layer disposed above and covers or substantially covers the entire surface of the photopolymerizable composition layer opposite the support. In this embodiment the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in U.S. Pat. No. 6,558,876; Fan in EP 0 741 330A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In some embodiments, the photosensitive element includes a layer of an actinic radiation opaque material adjacent the photopolymerizable layer, opposite the support. In other embodiments, the photosensitive element will not initially include the actinic radiation opaque layer, but will undergo one or more steps to form an in-situ mask (prior to exposure to actinic radiation). As such the photosensitive element includes an image of actinic radiation opaque material suitable for use as an in-situ mask adjacent the photopolymerizable layer.

In some embodiments, the actinic radiation opaque layer comprises a radiation-opaque material, an infrared-absorbing material, and an optional binder. The optional binder is a polymeric material which includes, but is not limited to, self-oxidizing polymers; non-self-oxidizing polymers; thermochemically decomposable polymers; polymers and copolymers of butadiene and isoprene with styrene and/or olefins; pyrolyzable polymers; amphoteric interpolymers; polyethylene wax, materials conventionally used as a release layer, such as polyamides, polyvinyl alcohols, hydroxyalkyl cellulose, and copolymers of ethylene and vinyl acetate; and combinations thereof. The actinic radiation opaque layer contains an infrared-absorbing material having high absorption in the wavelength (infrared range between 750 and 20,000 nm, such as, for example, polysubstituted phthalocyanine compounds, cyanine dyes, merocyanine dyes, etc., inorganic pigments, such as, for example, carbon black, graphite, chromium dioxide, etc., or metals, such as aluminum, copper, etc. The quantity of infrared absorbing material is usually 0.1-40% by weight, relative to the total weight of the layer. To achieve the desired optical density to block actinic radiation, the actinic radiation opaque layer contains a radiation-opaque material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1-70% by weight relative to the total weight of the layer. Dark inorganic pigments, such as carbon black and graphite, mixtures of pigments, metals, and metal alloys generally function as both infrared-sensitive material and radiation-opaque material. Other auxiliary agents, such as plasticizers, coating aids, etc. are possible. The actinic radiation opaque layers and their preparation are described in detail, for example in WO 94/03838 and WO 94/3839. The thickness of the actinic radiation opaque layer should be in a range to optimize both sensitivity and opacity, which is generally from about 20 Angstroms to about 50 micrometers. The actinic radiation opaque layer should have a transmission optical density of greater than 1.5 in order to effectively block actinic radiation and the polymerization of the underlying photopolymerizable composition layer. In most embodiments, the actinic radiation opaque layer is also removable during thermal treating, but can also be soluble or dispersible in a developer solution for solution development.

The photosensitive element may also include a temporary coversheet on top of the uppermost layer of the element, which is removed prior to preparation of the printing form. One purpose of the coversheet is to protect the uppermost layer of the photosensitive element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film.

The photosensitive element is converted to a printing form by undergoing the steps of exposing (including imagewise exposure and optionally backflash exposure) and thermal treating to form a relief surface on the printing form suitable for relief printing. In the present invention, thermal treating includes vibrational-thermal development. The exposure process includes a front image-wise exposure and usually a back exposure through the support even though the back exposure is not strictly necessary. The back exposure or "backflash" can take place before, after, or during image-wise exposure.

Upon imagewise exposure, the radiation-exposed areas of the photosensitive layer are converted to the insoluble state with no significant polymerization or crosslinking taking place in the unexposed areas of the layer. Any conventional source of actinic radiation can be used for this exposure. Examples of suitable radiation sources include xenon lamps, mercury vapor lamps, carbon arcs, argon glow lamps, fluorescent lamps with fluorescent materials emitting UV radiation and electron flash units, and photographic flood lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. The exposure time may vary from a few seconds to minutes, depending upon the intensity and spectral energy distribution of the radiation, its distance from the photosensitive element, and the nature and amount of the photopolymerizable material.

Imagewise exposure can be carried out by exposing the photosensitive element through an image-bearing photomask. The photomask can be a separate film, i.e., an image-bearing transparency or phototool, such as a silver halide film; or the photomask can be integrated with the photosensitive element as described above. In one embodiment in which the photomask is a separate film, the optional cover sheet is usually stripped before imagewise exposure leaving the release layer on the photosensitive element. The photomask film is brought into close contact with the release layer of the photosensitive element by the usual vacuum processes, e.g., by use of a common vacuum frame. Thus a substantially uniform and complete contact between the photosensitive element and the photomask can be achieved in acceptable time.

In another embodiment, the photosensitive element includes the actinic radiation opaque layer which becomes the integrated photomask which may also be referred to as an in-situ mask. In some embodiments, the actinic radiation opaque layer is imagewise exposed to IR laser radiation to form the photomask on the photosensitive element. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. In so-called digital imaging, the radiation opaque layer is exposed imagewise to infrared laser radiation to form the image on or disposed above the photopolymerizable composition layer, i.e., the in-situ mask. The infrared laser radiation can selectively remove, e.g., ablate or vaporize, the radiation opaque layer (i.e., infrared sensitive layer) from the photopolymerizable composition layer, as disclosed by Fan in U.S. Pat. Nos. 5,262,275 and 5,719,009; and Fan in EP 0 741 330 B1. The integrated photomask remains on the photosensitive element for subsequent steps of imagewise main exposure to actinic radiation, i.e., ultraviolet radiation, and thermal treating.

In another embodiment for digitally forming the in-situ mask, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable composition layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable composition layer as disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

In another embodiment, digital mask formation can be accomplished by imagewise application of the radiation opaque material in the form of inkjet inks on the photosensitive element. Imagewise application of an ink-jet ink can be directly on the photopolymerizable composition layer or disposed above the photopolymerizable composition layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable composition layer opposite the support. The photopolymerizable composition layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

Following overall exposure to UV radiation through the image-bearing mask, the photosensitive element is thermally treated as described above to remove unpolymerized areas in the photopolymerizable composition layer and thereby form a relief image. In the present invention, thermal treatment of the photosensitive element includes vibrational-thermal development wherein heating is provided by vibrational means as described above. The vibrational-thermal development process can remove at least the photopolymerizable material in the areas which were not exposed to actinic radiation, i.e., the unexposed areas or uncured or unirradiated areas, of the photopolymerizable composition layer. Except for (the exposed portions of) the elastomeric capping layer, the additional layers that may be present on the photopolymerizable composition layer can also be removed or substantially removed from the polymerized areas of the photopolymerizable composition layer with the vibrationally-induced frictional treating.

The printing forms that are treated can be uniformly post-exposed to ensure that the photopolymerization process is complete and that the printing form will remain stable during printing and storage. This post-exposure step can utilize the same radiation source as the main exposure.

Detackification is an optional post-development treatment which can be applied if the surface of the flexographic printing plate is still tacky, such tackiness not generally being removed in post-exposure. Tackiness can be eliminated by methods well known in the art, such as treatment with bromine or chlorine solutions, and by exposure to radiation sources having a wavelength not longer than 300 nm.

Intermediate Medium

The intermediate medium is selected to have a melt temperature exceeding the melt or softening or liquefying temperature of the uncured or unirradiated portions of the radiation curable composition. The intermediate medium can be absorptive to the liquefied portions of the photosensitive element, or can be non-absorptive to the liquefied portions and not remove the liquefied portions upon contact at the localized zone. The intermediate medium is located between the vibrating horn and the exterior surface of the photosensitive element and may be used to protect the vibrating horn from the liquefied photopolymerizable material and/or to enhance the frictional energy that is induced by the vibrational means. The liquefied portions could be removed by other means as described above. Materials suitable as the intermediate medium are not limited provided that the intermediate medium does not absorb the vibrational energy, and the vibrational energy is capable of transmitting through the intermediate medium to frictionally heat the exterior surface of the photosensitive element. Examples of materials suitable as the intermediate medium, include but are not limited to papers, non-wovens, fabrics, polymeric films, thin metals, and metalized films.

Development Medium

In addition to the development medium being selected to have a melt temperature exceeding the melt or softening or liquefying temperature of the uncured or unirradiated portions of the radiation curable composition, the development medium is capable of removing the uncured portions of the photopolymerizable composition layer of the photosensitive element. The development medium should have sufficient capacity to absorb or wick away or retain the liquefied portions of the uncured regions of the photopolymerizable layer. The development medium could also be considered a blotting material wherein the uncured portions are removed by the development medium.

The development medium is also selected to have good tear resistance at the operating temperatures. Preferably, the selected material withstands temperatures required to process the photosensitive element during the vibrationally-induced frictional heating.

In some embodiments, the development medium can be composed of an absorbent material alone. In other embodiments, the development medium can include an absorbent material and a support adjacent the absorbent material as disclosed by Dudek et al. in U.S. Pat. No. 7,358,026 B2. The absorbent material is selected from non-woven materials, paper stocks, fibrous woven material, open-celled foam materials, porous materials that contain more or less a substantial fraction of their included volume as void volume. The absorbent materials should also possess a high absorbency for the molten elastomeric composition. The support for the development medium is selected to be tear resistant, heat resistant, and when combined with the absorbent material the combination has improved mechanical properties to better withstand the rigors of thermal process than the mechanical properties of the absorbent material alone. In some embodiments, the support is non-porous, or substantially non-porous, or at least non-absorbing so as to prevent migration of the uncured material from the absorbent material to the underlying structure, e.g., contact surface of the vibrational means. The support for the development medium is not limited and can be selected from polymeric films, papers, metals, fabrics, nonwovens, fabrics with nonwovens, and combinations thereof. Materials suitable as the development medium are not limited provided that the development medium does not absorb the vibrational energy, and the vibrational energy is capable of transmitting through the development medium to frictionally heat the exterior surface of the photosensitive element. The development medium can be in web or sheet form. In most embodiments, the absorbent material is a non-woven material in web form.

EXAMPLES

Example 1

A CYREL® photopolymer printing element, type FDI, 67 mils thick (thickness of the photopolymerizable layer and support) was used for thermal treating with ultrasonic energy. The printing element was cut into a strip 3 inches wide and 21 inches long (hereinafter referred to as the strip element) and was exposed to ultraviolet radiation through a phototool having a test pattern for 8 minutes, and blanket-exposed through the support side for 160 minutes to form a floor. The exposed strip element was clamped on both sides of the longer dimension onto a 0.5 inch thick aluminum plate in a custom-built ultrasonic scanning welder having an ultrasonic horn and transducer and other components as described below. The exposed strip element was positioned such that the support side of the strip element contacted the aluminum plate. A development medium consisting of a 1.5-inch wide strip of non-woven material 7 mils thick was placed on top (adjacent the exterior surface) of the strip element and taped down at one end. The un-energized ultrasonic horn and transducer was positioned such that the axis of the horn and transducer was perpendicular to the plane of the strip element, and the tip of the horn contacted the non-woven material against the exterior surface of the strip element. The transducer was a Dukane Corp., Model 41C28 40 kHz unit fitted with a Dukane Corp. 40 kHz 1.5× booster. The horn was custom made from titanium alloy (which includes 6% aluminum and 4% vanadium) and had rectangular tip dimensions of 0.375 inch by 1 inch. The long dimension of the horn tip was oriented perpendicular to the long dimension of the strip element.

The transducer was energized by a Dukane Corp. Model 43A175 40 kHz generator (power supply). A force of 12.5 lbs was applied to the transducer and horn in a direction perpendicular to the plane of the strip element. The transducer and horn assembly was moved at 0.75 inches per second to traverse down the 21 inch length of the strip element using a motor drive while the transducer was energized. While the transducer was energized and traversed, the non-woven development medium was pressed into the exterior surface of the strip element by frictional heating. As the transducer traversed down the length of the strip element, the non-woven material was manually pulled from the exterior surface of the strip element behind the advancing horn, removing a layer of softened unirradiated or uncured composition layer material that had absorbed into the non-woven development medium. Thus, a 1 inch wide swath of uncrosslinked material from the photopolymerizable layer was removed from the strip element where the strip element had not been crosslinked by the ultraviolet exposure. This scan-and-strip process was repeated 10 times with a new strip of non-woven material used each time. After the 10 passes, a micrometer was used to measure the thickness of the photopolymerizable layer, and determine that a total of 14 mil of the layer of the photopolymerizable composition had been removed from unexposed areas of the strip element for an average removal per pass of 1.4 mil.

What is claimed is:

1. A method for preparing a relief printing form from a photosensitive element having an exterior surface and comprising a layer of a photopolymerizable composition capable of being partially liquefied, comprising the steps of:
   (a) heating the exterior surface of the photosensitive element to a temperature sufficient to cause a portion of the layer to liquefy, forming liquefied material; and
   (b) removing at least a portion of the liquefied material; wherein the heating step is performed using vibrational energy to induce frictional heating, the vibrational energy being generated from a vibrational assembly comprising a vibrating horn coupled to a transducer, the vibrating horn supporting a development medium into contact with the exterior surface of the photosensitive element, and wherein the removing step comprises separating the development medium from the photosensitive element.

2. The method of claim 1 wherein the vibrational energy has a frequency between 20 hertz and 100 kilohertz.

3. The method of claim 1 further comprising providing movement between the vibrating assembly and the photosensitive element.

4. The method of claim 1 wherein the vibrating horn induces frictional heating of at least a portion of the photopolymerizable layer at a first zone of contact.

5. The method of claim 4 further comprising traversing the vibrating horn from the first zone of contact to one or more additional zones of contact.

6. The method of claim 1 wherein the vibrating horn directly or indirectly contacts the exterior surface at a first contact zone to provide the frictional heating at a first set of conditions comprising an amplitude of the vibrational energy, a time of contact between the vibrating horn and the exterior surface, and a pressure of the vibrating horn on the exterior surface.

7. The method of claim 6 further comprising changing the frictional energy induced at the first contact zone by changing one or more of the conditions of the first set of conditions.

8. The method of claim 6 wherein the vibrating horn contacts at one or more additional contact zones, and the frictional energy induced at each of the one or more contact zones can be the same or different as the frictional energy induced at the first contact zone.

9. The method of claim 6 further comprising changing the frictional energy by changing one or more of the conditions selected from the group consisting of the amplitude, the contact time, and the pressure.

10. The method of claim 1 further comprising repeating the steps of heating and removing at least once more.

11. The method of claim 1 further comprising providing additional heating of the exterior surface selected from the group consisting of conduction, convection, and radiation.

* * * * *